United States Patent
Akram et al.

[11] Patent Number: 6,022,750
[45] Date of Patent: Feb. 8, 2000

[54] METHOD FOR FABRICATING SEMICONDUCTOR INTERCONNECT HAVING TEST STRUCTURES FOR EVALUATING ELECTRICAL CHARACTERISTICS OF THE INTERCONNECT

[75] Inventors: Salman Akram; David R. Hembree, both of Boise, Id.

[73] Assignee: Micron Technology, Inc., Boise, Id.

[21] Appl. No.: 08/984,247

[22] Filed: Dec. 3, 1997

Related U.S. Application Data

[62] Division of application No. 08/640,472, May 1, 1996, Pat. No. 5,838,161.

[51] Int. Cl.⁷ .......................... G01R 31/26; H01L 21/66
[52] U.S. Cl. ................................. 438/18; 324/755
[58] Field of Search ..................... 324/754, 755; 438/18

[56] References Cited

U.S. PATENT DOCUMENTS

| | | | |
|---|---|---|---|
| 3,777,260 | 12/1973 | Davies et al. | 324/64 |
| 4,243,937 | 1/1981 | Multani et al. | 324/765 |
| 5,034,796 | 7/1991 | Zommer | 357/41 |
| 5,150,042 | 9/1992 | Look et al. | 324/158 F |
| 5,279,975 | 1/1994 | Devereaux et al. | |
| 5,302,891 | 4/1994 | Wood et al. | 324/158 F |
| 5,408,190 | 4/1995 | Wood et al. | 324/765 |
| 5,419,807 | 5/1995 | Akram et al. | 156/647 |
| 5,430,383 | 7/1995 | Boos | 324/642 |
| 5,457,400 | 10/1995 | Ahmad et al. | |
| 5,483,175 | 1/1996 | Ahmad et al. | |
| 5,483,741 | 1/1996 | Akram et al. | 29/846 |
| 5,487,999 | 1/1996 | Farnworth | 437/7 |
| 5,495,179 | 2/1996 | Wood et al. | 324/755 |
| 5,504,035 | 4/1996 | Rostoker et al. | 437/182 |
| 5,517,515 | 5/1996 | Spall et al. | 371/22.5 |
| 5,523,697 | 6/1996 | Farnworth et al. | 324/758 |
| 5,721,496 | 2/1998 | Farnworth et al. | |
| 5,742,169 | 4/1998 | Akram et al. | |
| 5,783,461 | 7/1998 | Hembree | |
| 5,815,000 | 9/1998 | Farnworth et al. | |
| 5,838,161 | 11/1998 | Akram et al. | |
| 5,878,485 | 3/1999 | Wood et al. | 29/825 |
| 5,949,241 | 9/1999 | Akram et al. | |

OTHER PUBLICATIONS

Schroder, Dieter, K., *Seiconductor Material and Device Characterization*, John Wiley & Sons Inc., pp. 9–13, 110–129, 286–288, 1990.

*Primary Examiner*—Brian Dutton
*Attorney, Agent, or Firm*—Stephen A. Gratton

[57] ABSTRACT

An interconnect for a semiconductor die includes integrally formed test structures for evaluating various electrical characteristics of the interconnect. The test structures can include Kelvin structures, van der Pauw structures, resistors, capacitors, contact chains, via chains, serpentine test structures, and antenna test structures. Among the electrical characteristics that can be evaluated are the resistivity of contact member, conductor and substrate components of the interconnect, contact resistance between the contact members and conductors and capacitance of the contact members and conductors with respect to the substrate.

25 Claims, 4 Drawing Sheets

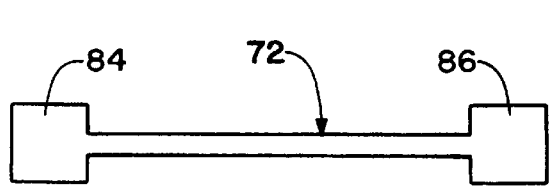
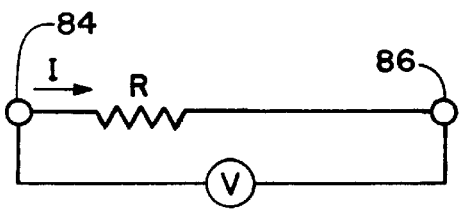
FIGURE 5      FIGURE 5A
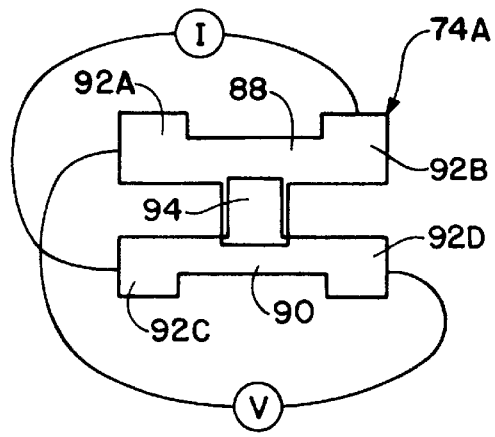
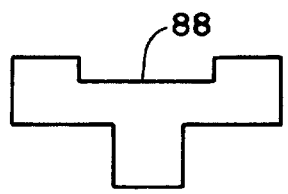
FIGURE 6B
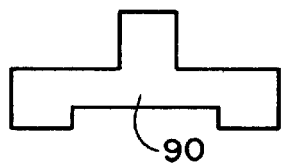
FIGURE 6C
FIGURE 6
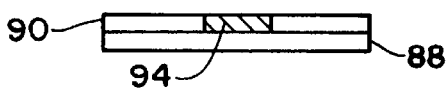
FIGURE 6A
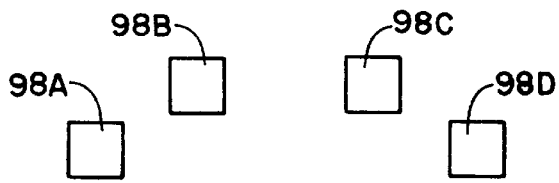
FIGURE 7A
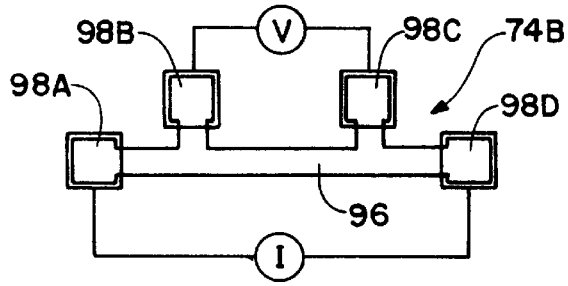
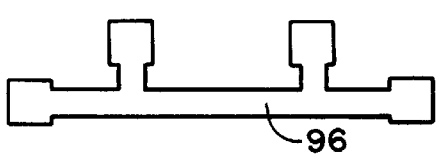
FIGURE 7      FIGURE 7B

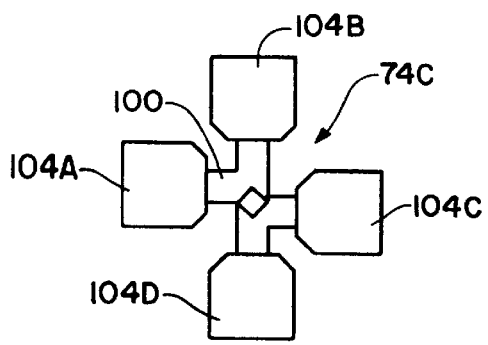
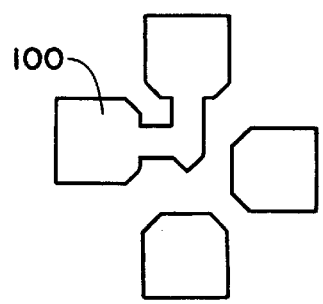
FIGURE 8       FIGURE 8A
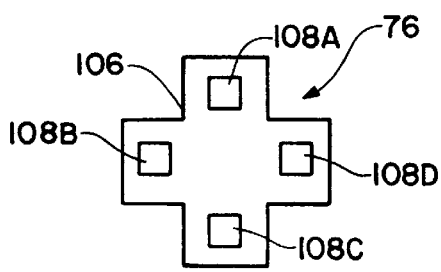
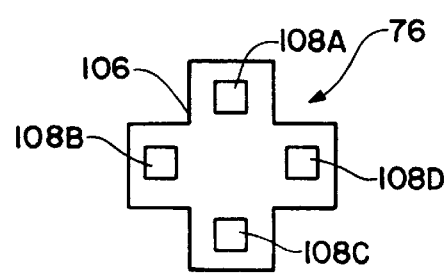
FIGURE 9       FIGURE 8B
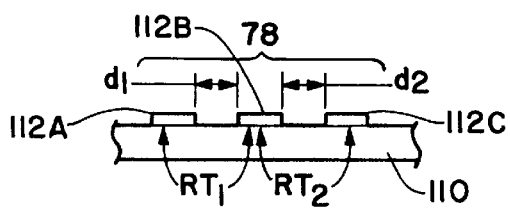
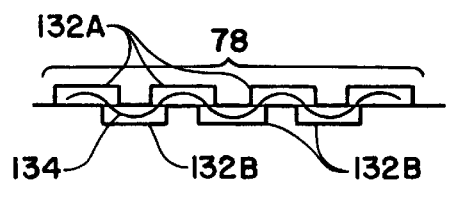
FIGURE 10      FIGURE 10A
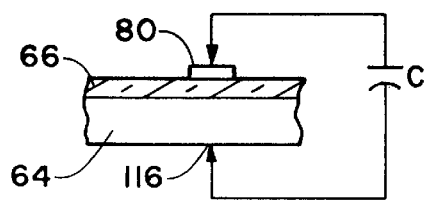
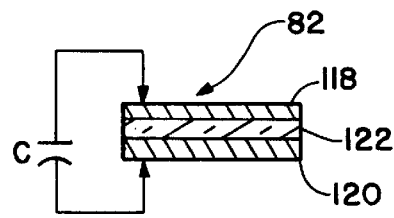
FIGURE 11      FIGURE 12
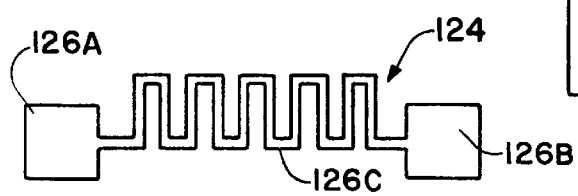
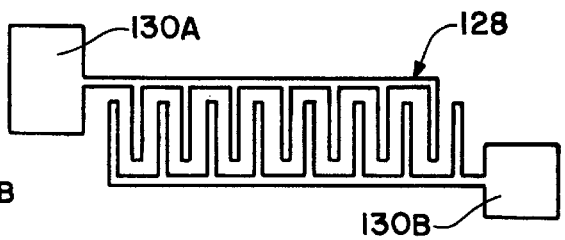
FIGURE 13      FIGURE 14

METHOD FOR FABRICATING SEMICONDUCTOR INTERCONNECT HAVING TEST STRUCTURES FOR EVALUATING ELECTRICAL CHARACTERISTICS OF THE INTERCONNECT

CROSS REFERENCE TO RELATED APPLICATION

This application is a division of U.S. patent application Ser. No. 08/640,472 filed on May 1, 1996, now U.S. Pat. No. 5,838,161.

FIELD OF THE INVENTION

This invention relates to semiconductor manufacture and specifically to test methods and test structures for evaluating the electrical characteristics of interconnects used for testing bare semiconductor dice.

BACKGROUND OF THE INVENTION

Unpackaged or bare semiconductor dice are used to construct multi chip modules (MCMs) and other electronic devices. Unpackaged dice must be tested and burned in during the manufacturing process to certify each die as a known good die. This has led to the development of temporary packages that hold a single bare die for testing and burn-in. The temporary packages provide the electrical interconnection between the test pads on the die and external test circuitry. Exemplary temporary packages are disclosed in U.S. Pat. Nos. 5,302,891; 5,408,190 and 5,495,179 to Wood et al., which are incorporated herein by reference.

Typically, this type of temporary package includes an interconnect having contact members that make a temporary electrical connection with the test pads on the die. The temporary package can also include a force applying mechanism that presses the die against the interconnect. For example, in the above cited patents the force applying mechanism can include a clamp mechanism that attaches to a package base, and a spring that presses the die against the interconnect.

Typically, the interconnect for the temporary package includes a substrate wherein the contact members are formed. One type of interconnect is formed of silicon and includes raised contact members formed as etched pillars having penetrating projections. The penetrating projections are adapted to penetrate into the bond pads on the die to form a temporary electrical connection for testing. A conductive layer overlies each raised contact member and is in contact with a conductor (e.g., metal trace) formed on the substrate. The conductors can be wire bonded, or otherwise electrically connected, to corresponding external contacts on the base of the temporary package. This type of interconnect is described in U.S. Pat. No. 5,483,741 to Akram et al., which is incorporated herein by reference.

Another type of interconnect includes a substrate and microbump contact members mounted on the substrate. The substrate in this case can be silicon, or a low CTE material such as ceramic or glass. The microbump contact members and conductors can be in the form of a flexible tape similar to two layer TAB tape. This type of interconnect is described in U.S. Pat. No. 5,487,999 to Farnworth, which is incorporated herein by reference.

In general, the electrical characteristics of the interconnects can have an affect on the die test procedure. In particular, the electrical characteristics of the contact members and the conductors can have a profound affect on the test procedure. Significant electrical parameters include the resistivity of the contact members, the resistivity of the conductors, the contact resistance at the interface of the contact members and conductors, and the capacitance between the conductors and the substrate. In order for the interconnect to provide valid test data, the value of these electrical parameters must fall within relatively narrow ranges.

Defects in the interconnect can also have an affect on the electrical characteristics of the interconnect. For example, an insulating layer that insulates the conductors from the substrate can be defective allowing current to leak from one or more conductors into the substrate. The substrate can also include cracks that propagate through the insulating layer creating undesirable electrical paths in the assembled temporary package.

These types of defects can be present as a result of the fabrication process for the interconnect. Also, since the interconnects are designed to be reused many times, defects can arise as a result of continued usage of the interconnects. For example, the interconnects are repeatedly stressed by the force applying mechanism of the temporary package which biases the die and interconnect together. In addition, the interconnects are repeatedly subjected to thermal cycling in a burn-in oven.

In view of the foregoing, it would be desirable to have a method for evaluating the electrical characteristics of interconnects used to test bare semiconductor dice.

Accordingly, it is an object of the present invention to provide a method for testing interconnects for bare semiconductor dice using test structures formed on the interconnect.

It is yet another object of the present invention to provide an improved interconnect for testing semiconductor dice having various test structures formed thereon for evaluating various electrical characteristics of the interconnect.

It is a still further object of the present invention to provide a method for fabricating test structures for interconnects for bare semiconductor dice.

Other objects, advantages and capabilities of the present invention will become more apparent as the description proceeds.

SUMMARY OF THE INVENTION

In accordance with the present invention, a method for testing interconnects for semiconductor dice and an improved interconnect for semiconductor dice are provided. In an illustrative embodiment, the interconnect includes contact members and conductors formed on a silicon substrate. The contact members include a conductive layer that is in electrical communication with the conductors. In addition, an insulating layer electrically insulates the contact members and conductors from the substrate.

The interconnect also includes integrally formed test structures adapted to evaluate the electrical characteristics of the interconnect. The test structures can be configured for use with probe instruments or can be configured with a dedicated electrical path. Among the electrical characteristics that can be evaluated are the resistivity of the contact members and conductors, the contact resistance between the contact members and conductors, the capacitance between the conductors and the substrate or between the contact members and substrate, and the integrity of the insulating layer.

Exemplary test structures can include Kelvin structures, van der Pauw structures and contact chains formed on the interconnect for evaluating the resistivity and contact resistance of the contact members and conductors. In addition, capacitor test structures and capacitance contacts can be formed on the interconnect for evaluating the electrical capacitance between the conductors and the substrate and the integrity of the insulating layer. Other exemplary test structures can include serpentine structures, antennae structures, comb structures and via chains.

BRIEF DESCRIPTION OF THE DRAWINGS

FIG. 5 is a plan view of a resistor test structure formed on the interconnect;

FIG. 5A is an electrical schematic illustrating an electrical test using the test structure of FIG. 5;

FIG. 6 is a plan view of a Kelvin structure formed on the interconnect;

FIG. 6A is a cross sectional view of FIG. 6;

FIG. 6B is a plan view of a portion of the Kelvin structure of FIG. 6;

FIG. 6C is a plan view of a portion of the Kelvin structure of FIG. 6;

FIG. 7 is a plan view of a Kelvin structure formed on the interconnect;

FIG. 7A is a plan view of a portion of the Kelvin structure of FIG. 7;

FIG. 7B is a plan view of a portion of the Kelvin structure of FIG. 7;

FIG. 8 is a plan view of a Kelvin structure formed on the interconnect;

FIG. 8A is a plan view of a portion of the Kelvin structure of FIG. 8;

FIG. 8B is a plan view of a portion of the Kelvin structure of FIG. 8;

FIG. 9 is a plan view of a van der Pauw structure formed on the interconnect;

FIG. 10 is an schematic view of a contact chain formed on the interconnect;

FIG. 10A is a schematic view of an alternate embodiment contact chain formed on the interconnect;

FIG. 11 is a schematic view of capacitance contacts formed on the interconnect;

FIG. 12 is a schematic view of a capacitor test structure formed on the interconnect;

FIG. 13 is a plan view of a serpentine structure formed on the interconnect; and FIG. 14 is a plan view of a comb structure formed on the interconnect.

DETAILED DESCRIPTION OF THE PREFERRED EMBODIMENTS

Figure 1:
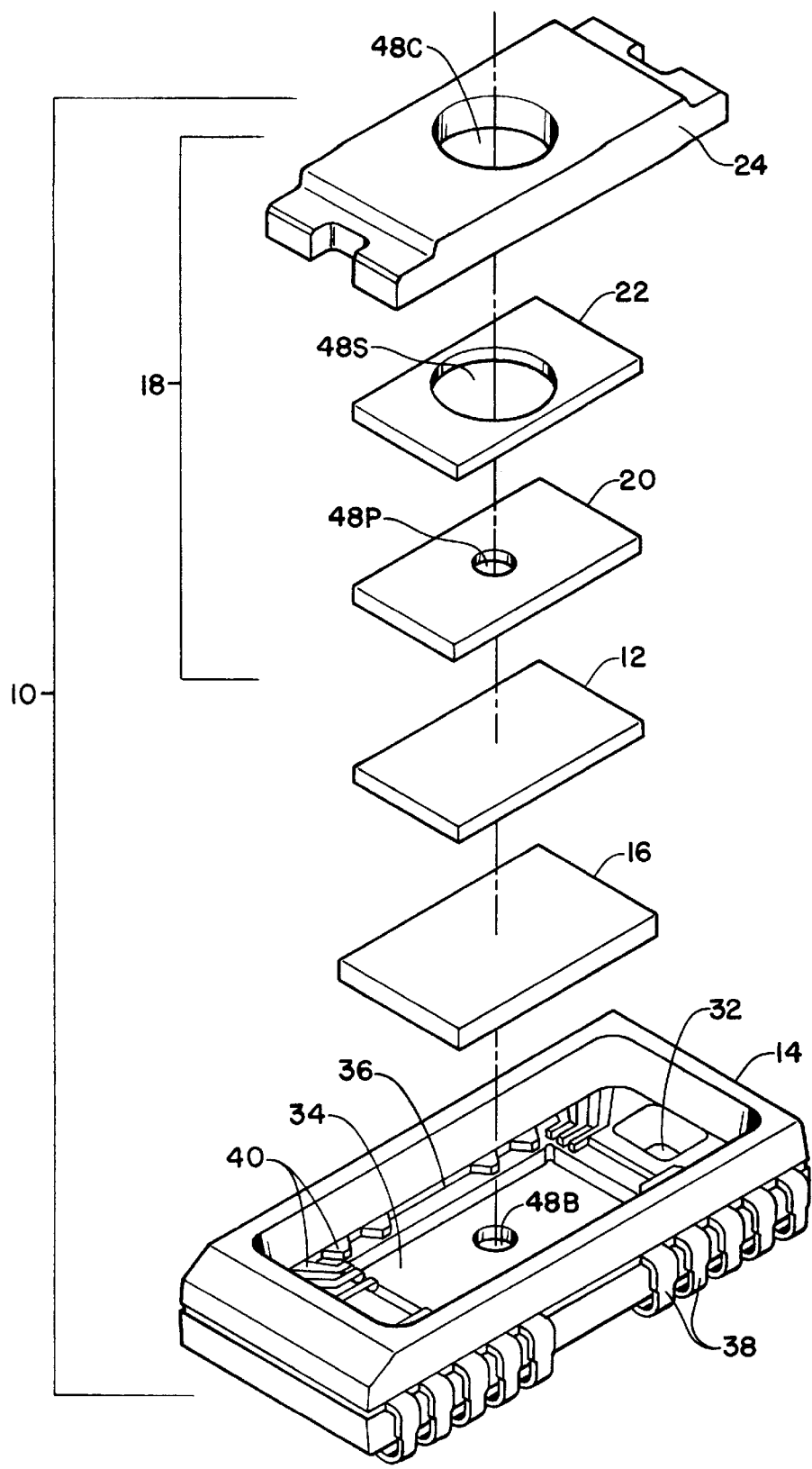
FIG. 1 is an exploded view of a temporary package for testing bare semiconductor dice having an interconnect constructed in accordance with the invention.

Referring to FIG. 1, a temporary package 10 and an interconnect 16 constructed in accordance with the invention are shown. The temporary package 10 includes a package base 14 and a force applying mechanism 18. The interconnect 16 establishes electrical communication between the package base 14 and the die 12. The force applying mechanism 18 secures the die 12 to the package base 14 and presses the die 12 against the interconnect 16. The force applying mechanism 18 includes a pressure plate 20, a spring 22 and a cover 24. The package 10 also includes a latching mechanism in the form of clips 26, 28 (FIG. 2) which secure the force applying mechanism 18 to the package base 14.

In the illustrative embodiment, the package 10 has an outline that is substantially equivalent to the outline of a conventional semiconductor package. Further details of the temporary package 10 are disclosed in U.S. patent application Ser. No. 08/580,687, now U.S. Pat. No. 5,815,000, incorporated herein by reference.

Figure 2:
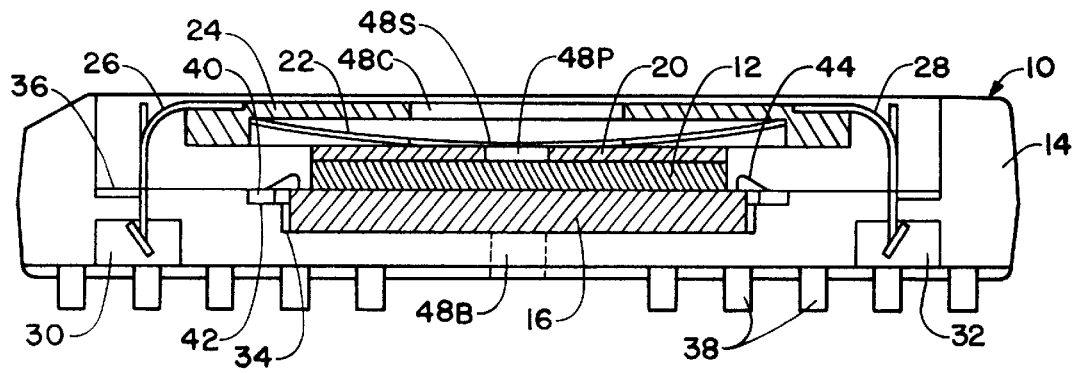
FIG. 2 is a cross sectional view of the assembled temporary package shown in FIG. 1.

As shown in FIG. 2, in the assembled package 10, the die 12 is held within a recess 36 formed within the package base 14 and is compressed between the interconnect 16 and the cover 24. The interconnect 16 is also mounted within a recess 34 formed within the package base 14. As also shown in FIG. 2, in the assembled package 10, the pressure plate 20 overlies the die 12, and the spring 22 presses the pressure plate 20 and the die 12 against the interconnect 16.

Still referring to FIG. 2, the clips 26, 28 attach to corresponding openings 30, 32 in the base 14 to secure the cover 24, spring 22 and pressure plate 20 of the force applying mechanism 18 and the die 12 within the package base 14. The cover 24, spring 22, pressure plate 20 and base 14 all include a central opening which are designated 48C, 48S, 48P and 48B respectively. The openings 48C, 48S, 48P and 48B are used during assembly of the package 10 to permit the die 12 to be held by a vacuum tool (not shown) during optical alignment of the die 12 and interconnect 16. In a similar manner, a vacuum tool (not shown) can be used to disassemble the package 10. As also shown in FIG. 2, the interconnect 16 for the package 10 can be wire bonded to conductive traces 40 on the package base 14 and to bonding sites 56 (FIG. 3) on the interconnect 16 using bond wires 44.

Figure 3:
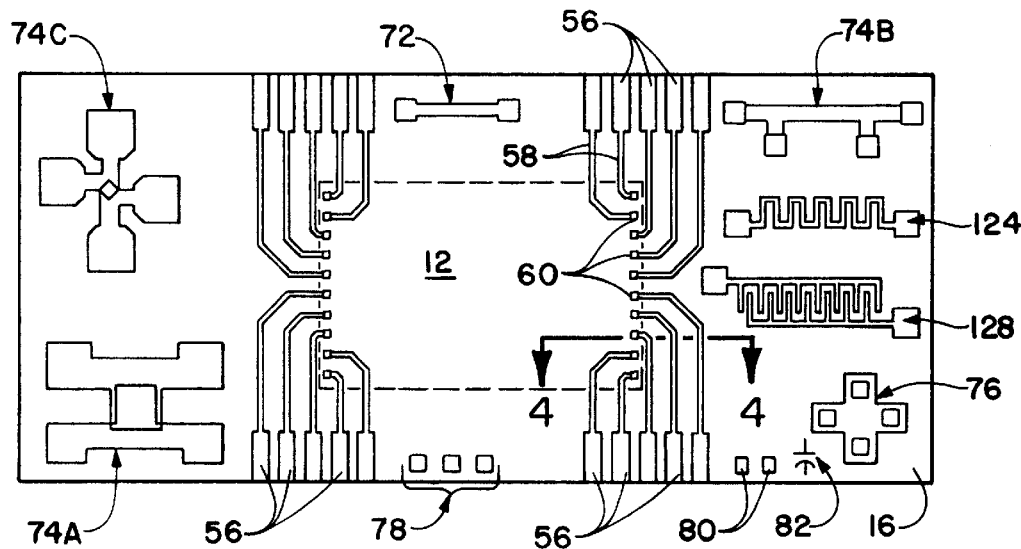
FIG. 3 is a plan view of the interconnect constructed in accordance with the invention.
Figure 4:
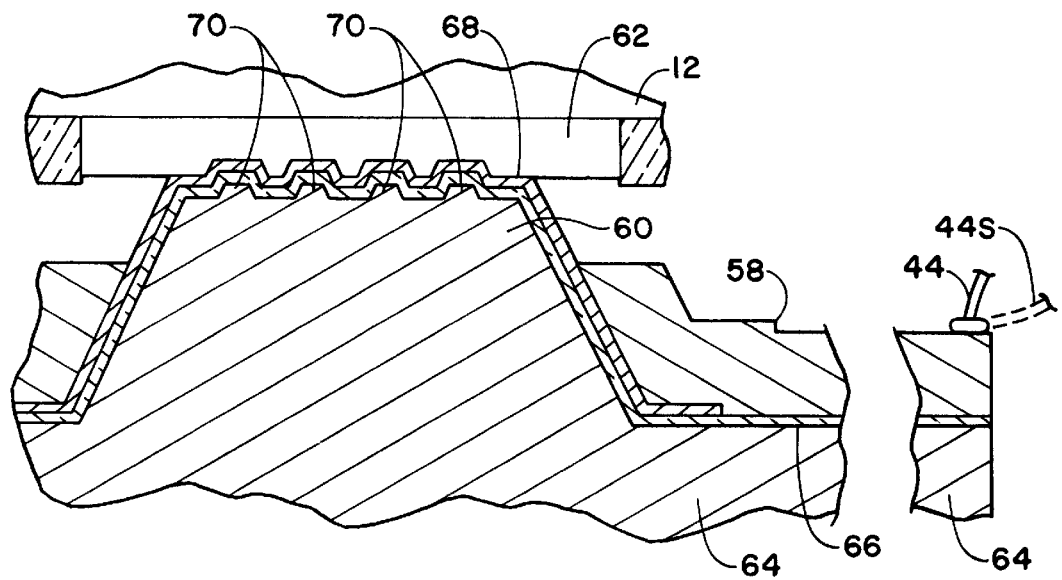
FIG. 4 is an enlarged cross sectional view taken along section line 4—4 of FIG. 3.

Referring to FIG. 3, the interconnect 16 includes a pattern of conductors 58 and raised contact members 60. The raised contact members 60 are formed in a pattern that corresponds to test pads 62 (FIG. 4) on the die 12. As shown in FIG. 4, the raised contact members 60 are adapted to contact and establish an electrical connection with the test pads 62 on the die 12. In addition, the raised contact members 60 can include penetrating projections 70 formed as elongated blades adapted to penetrate the pads 62 on the die 12 to a self limiting penetration depth.

The interconnect 16 and raised contact members 60 can be formed by etching a silicon substrate 64. An insulating layer 66 and a conductive layer 68 are formed on the substrate 64 atop the raised contact members 60. In the assembled package 10, the conductive layer 68 is in electrical communication with the conductors 58 and bonding sites 56 which are wire bonded to bond wires 44. Alternately, in place of wire bonding in the assembled package 10, an electrical connection can be formed to the conductors 58 with slide contacts 44S.

A suitable process for forming the interconnect 16, substantially as shown in FIGS. 3 and 4, is disclosed in U.S. Pat. Nos. 5,326,428; 5,419,807 and 5,483,741 which are incorporated herein by reference.

In accordance with the invention, the interconnect 16 includes one or more test structures adapted to evaluate various electrical characteristics of the interconnect 16. Exemplary test structures include a resistor test structure 72, a Kelvin structure 74A, a Kelvin structure 74B, a Kelvin structure 74C, a van der Pauw structure 76, a contact chain 78, capacitance contacts 80, a capacitor test structure 82, a serpentine test structure 124 and a comb test structure 128.

As is apparent these test structures are merely exemplary and other test structures could be used. In general, the test structures are illustrated schematically for use with probe contacts of a measuring instrument such as a four point probe for resistivity measurements or a capacitance meter for capacitance measurements. However, it is also possible to provide an electrical path (e.g., wire bonds) from the test structures to dedicated external leads 38 (FIG. 1) on the temporary package 10. This would permit various electrical characteristics of the interconnect 16 to be monitored with the interconnect 16 assembled in the temporary package 10.

Referring to FIGS. 5 and 5A, the resistor test structure 72 is shown separately. The resistor test structure 72 includes a layer of material deposited on the surface of the interconnect 16. The resistor test structure 72 includes contacts 84, 86 on each end. The contacts 84, 86 can be formed of a single layer of material or as a bi-metal stack.

As shown in FIG. 5A, current (I) is passed between the contacts 84, 86 while the voltage (V) is measured. The current and voltage can be applied to the contacts 84, 86 using a conventional probe instrument. The resistance can then be determined using the well known formula V=IR where V is the voltage, I is the current and R is the resistance. A sheet resistance ρs having the units of μohms per square ($\mu\Omega$/sq) can then be determined using constants based on the dimensions of the resistor test structure 72 or the spacing of the probes.

For evaluating the sheet resistance of the conductive layer 68 (FIG. 4), the resistor test structure 72 can be formed of a same material as the conductive layer 68. With the type of interconnect 16 illustrated in FIGS. 3 and 4, the conductive layer 68 will typically be a metal silicide layer formed by depositing a silicon containing layer (e.g., polysilicon, amorphous silicon) and a metal layer (e.g., titanium, tungsten, platinum) and then reacting these layers. The unreacted metal and silicon are then removed leaving the metal silicide layer. The resistor test structure 72 can be formed at the same time as the conductive layer 68 (FIG. 4) for the contact members 60 by use of a photolithographic process with a suitable mask pattern. The mask pattern can also be formed to locate the resistor test structure 72 at a convenient testing location on the interconnect 16 such as along an edge thereof.

For evaluating the sheet resistance of the conductors 58, the resistor test structure 72 can be formed of a same material as the conductors 58. The conductors 58 will typically be a highly conductive metal such as aluminum, copper, titanium, tungsten, tantalum and molybdenum or alloys of these metals. Preferably the resistor test structure 72 can be formed at the same time as the conductors 58 (FIG. 4) by use of appropriate masks.

The total resistance of the conductive layer 68 (FIG. 4) and conductors 58 (FIG. 4) can also be evaluated by forming the contacts 84, 86 for the resistor test structure 72 as a bi-metal stack. In this case, a lower layer of the contacts 84, 86 can be formed of a same material as the conductive layer 68 and a top layer of the contacts 84, 86 can be formed of a same material as the conductors 58. As is apparent, this order of materials can be reversed.

Referring to FIGS. 6–6C, the Kelvin structure 74A is shown. The Kelvin structure 74A comprises a first layer of material 88 (FIG. 6B) and a second layer of material 90 (FIG. 6C) overlaid as shown in FIG. 6A. The first layer of material 88 can be formed of the same material as the conductive layer 68 (FIG. 4). The second layer of material 90 can be formed of the same material as the conductors 58 (FIG. 4). The layers 88, 90 are shaped substantially as shown (i.e., generally T-shaped) such that four contacts 92A–D and a bi-metal connecting segment 94 are formed. This type of structure is also known in the art as a cross-bridge Kelvin resistor (CBKR).

In this case current is passed between pads 92B and 92C and the voltage between pads 92A and 92D is measured. A high impedance voltmeter can be used to measure the voltage such that there is very little current flow between pads 92A and 92D. The voltage drop is thus essentially a function of the connecting segment 94. This voltage drop corresponds to the contact resistance between the conductive layer 68 (FIG. 4) and the conductors 58 (FIG. 4). The contact resistance $R_c$ in μohms/square can be determined by the formula $R_c$=V/I. Since the area of the connecting segment 94 is known, the specific contact resistance ($\rho_c$) can also be determined by the formula $\rho_c=R_c A_c$.

Referring to FIGS. 7–7B, another type of Kelvin structure 74B is shown. Kelvin structure 74B includes a first layer of material 96 formed of the same material as the conductive layer 68 (FIG. 4) and with a shape substantially as shown in FIG. 7B. Four contacts 98A–98D are overlaid on the first layer of material 96. The contacts 98A–98D are formed of a same material as the conductors 58 (FIG. 4). As with the previous Kelvin structure 74A, current is passed between contacts 98A and 98D while a voltage drop between contacts 98B and 98C is measured. Again the resistance R and the contact resistance $R_c$ of the contacts 98A–98D can be ascertained using the previously stated formulas relating voltage, current and resistance. This contact resistance corresponds to the contact resistance between the conductive layer 68 and conductors 58.

Referring to FIGS. 8–8C, Kelvin structure 74C is shown. Kelvin structure 74C includes a first layer of material 100 overlaid on a second layer of material 102 to form bi-metal contacts 104A–D. The first layer of material 100 (FIG. 8A) can be formed of a same material as the conductive layer 68 (FIG. 4). The second layer of material 102 (FIG. 8B) can be formed of a same material as the conductors 58 (FIG. 4). This forms a cross bridge Kelvin resistor that is substantially equivalent to the Kelvin structure 74A previously described.

Referring to FIG. 9, the van der Pauw structure 76 is shown. In general, van der Pauw structures are geometrical patterns having four contacts used to characterize the resistivity of a layer. Van der Pauw structure 76 is a layer of material 106 formed as a Greek cross with four contacts 108A–D. Using a conventional four-point probe, voltage measurements can be made for different current directions across the contacts 108A–D. The sheet resistance is given by the formula $\rho_c$=4.532R.

The van der Pauw structure 76 can be formed of the same material as the conductive layer 68 (FIG. 4) or the conductors 58 (FIG. 4) using conventional photolithographic techniques. The resistivity of the van der Pauw structure 76 corresponds to the resistivity of the conductive layer 68 or conductors 58. Other representative van der Pauw structures include circles, squares, clover-leafs, rectangles and the cross and bridge structure (not shown).

Referring to FIG. 10, the contact chain 78 is shown in cross section. The contact chain 78 comprises a trace layer 110 having three contacts 112A–C formed thereon. By way of example the trace layer 110 can be formed of the same material as the conductive layer 68 (FIG. 4) and the contacts 112A–C can be formed of the same material as the conductors 58 (FIG. 4). The contact resistance $R_c$ can be determined by the formula:

$$R_c=(R_{T2}d_1-R_{T1}d_2)/2(d_1-d_2)$$

where $R_{T1}$ is the resistance between 112A and 112B $R_{T2}$ is the resistance between 112B and 112C $d_1$ is the separation between 112A and 112B $d_2$ is the separation between 112B and 112C Referring to FIG. 10A, an alternate contact chain 78A includes a first set of contacts 132A formed of a same material as conductors 58 (FIG. 4) and a second set of contacts 132B formed of a same material as conductive layer 68 (FIG. 4). Current flow 134 through the contact chain 78A can be measured as previously described to evaluate the resistance R and contact resistance $R_c$ of the conductors 58 (FIG. 4) and conductive layer 68 (FIG. 4).

Referring to FIG. 11, capacitance measurements can be made using the capacitance contacts 80 formed on the front side of the interconnect 16 and corresponding test locations 116 on the back side of the interconnect 16. The capacitance contacts 80 can be formed of the same material as the conductive layer 68 or of the same material as the conductors 58. The first contact 80 could actually be the conductor 58 (FIG. 4). The test locations 116 on the backside of the interconnect 16 can be anywhere on the surface of the silicon. Using a capacitance meter, the capacitance (C) between the capacitance contacts 80 and the substrate 64 of the interconnect 16 is measured at different voltages. This enables an experimental C-V curve to be derived.

One suitable capacitance meter for supplying current and measuring the resultant potential is manufactured by Hewlett Packard and is designated a model 4275 LCR meter. This meter includes five terminals of which one terminal is grounded, two terminals supply current and two terminals measure the potential. Accordingly for use with this meter, two capacitance contacts 80 and two test locations 116 would be provided.

In general, the capacitance measured in FIG. 11 is a measure of the integrity of the insulating layer 66. The insulating layer 66 can contain defects such as cracks and pin holes that can compromise its insulating ability. Moreover, these defects can develop during use of the interconnect 16 as it is repeatedly loaded by the force applying mechanism 18 (FIG. 1) and stressed by temperature cycling. In addition, the structure of FIG. 11 can be used to perform time-dependent-dielectric breakdown (TDDB) tests to evaluate the oxide quality.

Referring to FIG. 12, capacitance can also be measured using a capacitor test structure 118 formed on the interconnect. The capacitor test structure 118 includes an upper plate 118 and a lower plate 120 separated by a dielectric layer 122. The dielectric layer 122 can be made of a same material and thickness as the insulating layer 66 (FIG. 4) for the interconnect 16. In this case a dedicated electrical path can be made between the upper plate 118 and the lower plate 120 and external leads 38 (FIG. 1) on the package 10. By applying current and measuring the resultant potential the capacitance (C) of the capacitor test structure 118 can be determined.

Referring to FIG. 13, the serpentine test structure 124 includes contacts 126A and 126B and a serpentine body 126C. The serpentine test structure 124 can be constructed of the same materials as conductive layer 68 (FIG. 4) or conductors 58 (FIG. 4) or a combination these materials. The serpentine test structure 124 functions substantially similar to the resistor 72 (FIG. 5) previously described.

Referring to FIG. 14, the comb structure 128 includes a first comb 130A and a second comb 130B. The combs 130A and 130B can be formed of a same material as the conductive layer 68 (FIG. 4) or of a same material as the conductors 58 (FIG. 4). The combs 130A and 130B are constructed to be intertwined yet electrically unconnected. Thus when a voltage is applied between the combs 130A and 130B there should be no current. A flow of current indicates a short between the combs 130A and 130B. The comb structure 128 can be used as a process monitor during the formation of the conductive layer 68 (FIG. 4) and conductors 58 (FIG. 4).

Thus the invention provides an improved interconnect 16 for bare semiconductor dice and an improved method for evaluating the electrical characteristics of the interconnect 16. Although exemplary test structures have been described other test structures can also be utilized. Other exemplary test structures can include serpentine structures, antennae structures, comb structures and via chains.

While the invention has been described with reference to certain preferred embodiments, as will be apparent to those skilled in the art, certain changes and modifications can be made without departing from the scope of the invention as defined by the following claims.

What is claimed is:

1. A method for testing an interconnect for a semiconductor die comprising:

providing the interconnect with a contact member comprising a conductive layer configured to electrically engage a contact location on the die, and a conductor in electrical communication with the conductive layer;

providing a test structure on the interconnect comprising a resistor comprising a same material as the conductive layer, or as the conductor, the resistor configured to evaluate a resistivity of the conductive layer or the conductor; and evaluating the resistivity using the test structure.

2. The method of claim 1 wherein the conductive layer and the resistor comprise a same layer of the material.

3. The method of claim 1 wherein the conductor and the resistor comprise a same layer of the material.

4. The method of claim 1 wherein the resistor comprises a serpentine structure.

5. The method of claim 1 wherein the test structure comprises a first contact and a second contact.

6. The method of claim 1 further comprising providing a second test structure on the interconnect configured to evaluate a contact resistance between the conductive layer and the conductor, and then evaluating the contact resistance using the second test structure.

7. The method of claim 1 further comprising providing a third test structure on the interconnect configured to evaluate a capacitance between the conductive layer or the conductor and a substrate of the interconnect, and then evaluating the capacitance using the third test structure.

8. The method of claim 1 wherein the resistor comprises a first contact and a second contact configured for electrical engagement by a probe instrument.

9. The method of claim 1 wherein the resistor comprises a first contact and a second contact configured for electrical communication with external leads on a test carrier.

10. A method for testing an interconnect for a semiconductor die comprising:

providing a contact member on the interconnect comprising a first conductive layer configured to electrically engage a contact location on the die;

providing a conductor on the interconnect comprising a second conductive layer in electrical contact with the first conductive layer;

providing a test structure on the interconnect comprising a first layer and a second layer in electrical contact, the first layer comprising a same material as the first conductive layer, the second layer comprising a same material as the second conductive layer, the test structure configured to evaluate a contact resistance between the conductive layer and the conductor; and evaluating the contact resistance using the test structure.

11. The method of claim 10 wherein the test structure comprises a Kelvin structure.

12. The method of claim 10 wherein the test structure comprises a van der Pauw structure.

13. The method of claim 10 wherein the test structure comprises a contact chain comprising a trace layer and at least one contact thereon.

14. The method of claim 10 wherein the test structure comprises a first set of contacts alternating with a second set of contacts.

15. A method for testing an interconnect for a semiconductor die comprising:

providing a plurality of contact members on the interconnect configured to electrically engage a plurality of test pads on the die;

providing a plurality of conductive layers on the contact members comprising a first layer of a first material;

providing a plurality of conductors on the interconnect in electrical communication with conductive layers and comprising a second layer of a second material;

providing a test structure on the interconnect configured to evaluate a contact resistance between the conductive layers and the conductors, the test structure comprising a portion of the first layer in electrical contact with a portion of the second layer; and evaluating the contact resistance using the test structure.

16. The method of claim 15 wherein the test structure comprises a first contact and a second contact configured for electrical engagement by a probe instrument.

17. The method of claim 15 wherein the test structure comprises a first contact and a second contact configured for electrical communication with external leads on a test carrier.

18. A method for testing an interconnect for a semiconductor die comprising:

providing a temporary package for retaining the die comprising a plurality of external leads;

providing an interconnect on the package comprising a contact member configured to electrically engage a contact location on the die;

providing a test structure on the interconnect configured to evaluate a resistivity of the contact member, the test structure in electrical communication with a first external lead and a second external lead on the package;

assembling the die in the package with the contact member and the contact location in electrical communication; and evaluating the resistivity by applying test signals through the first external lead and the second external lead to the test structure.

19. The method of claim 18 wherein the contact member and the test structure comprise different portions of a same layer of a conductive material.

20. A method for testing an interconnect for a semiconductor die comprising:

providing a temporary package for retaining the die comprising a plurality of external leads;

providing an interconnect on the package comprising a contact member configured to electrically engage a contact location on the die, and a conductor in electrical contact with the contact member;

providing a test structure on the interconnect configured to evaluate a contact resistance between the contact member and the conductor, the test structure in electrical communication with a first external lead and a second external lead on the package;

assembling the die in the package with the contact member and the contact location in electrical communication; and evaluating the contact resistance by applying test signals through the first external lead and the second external lead to the test structure.

21. The method of claim 20 wherein the test structure comprises an element selected from the group consisting of Kelvin structures, van der Pauw structures, and contact chains.

22. A method for testing an interconnect for a semiconductor die comprising:

providing the interconnect with a substrate comprising an insulating layer;

providing a contact member on the substrate comprising a conductive layer on the insulating layer configured to electrically engage a contact location on the die;

providing a test structure on the interconnect configured to evaluate an integrity of the insulating layer, the test structure comprising a first plate and a second plate on the substrate separated by a dielectric layer, the first plate comprising a same layer of material as the conductive layer and the dielectric layer comprising a same layer of material as the insulating layer; and evaluating a capacitance between the first plate and the second plate.

23. The method of claim 22 wherein the evaluating step is performed with a capacitance meter.

24. A method for testing an interconnect for a semiconductor die comprising:

providing the interconnect with a substrate comprising an insulating layer;

providing a contact member on the substrate;

providing a conductor on the substrate in electrical communication with the contact member;

providing a test structure on the interconnect configured to evaluate an integrity of the insulating layer, the test structure comprising a first plate and a second plate on the substrate separated by a dielectric layer, the first plate comprising a same layer of material as the conductor and the dielectric layer comprising a same layer of material as the insulating layer; and evaluating a capacitance between the first plate and the second plate.

25. The method of claim 24 wherein the evaluating step is performed with a capacitance meter.

* * * * *